United States Patent [19]
Cappelletti et al.

[11] Patent Number: 5,732,012
[45] Date of Patent: Mar. 24, 1998

[54] ROM CELL WITH REDUCED DRAIN CAPACITANCE

[75] Inventors: Paolo Cappelletti, Seveso; Silvia Lucherini, Milan; Bruno Vajana, Bergamo, all of Italy

[73] Assignee: SGS-Thomson Microelectronics, S.r.l., Agrate Brianza, Italy

[21] Appl. No.: 210,595

[22] Filed: Mar. 17, 1994

Related U.S. Application Data

[62] Division of Ser. No. 668,873, Mar. 13, 1991, Pat. No. 5,328,863.

[30] Foreign Application Priority Data

Mar. 15, 1990 [IT] Italy ............... 90-19694

[51] Int. Cl.[6] ............................................ G11C 17/12
[52] U.S. Cl. ...................... 365/104; 365/178; 257/336
[58] Field of Search ............................ 365/104, 178; 257/336

[56] References Cited

U.S. PATENT DOCUMENTS

| | | | |
|---|---|---|---|
| 4,059,826 | 11/1977 | Rogers | 365/178 |
| 4,208,780 | 6/1980 | Richman. | |
| 4,225,875 | 9/1980 | Ipri | 257/336 |
| 4,376,947 | 3/1983 | Chiu et al. | 257/336 |
| 4,513,494 | 4/1985 | Batra. | |
| 4,514,897 | 5/1985 | Chiu et al.. | |
| 4,536,944 | 8/1985 | Bracco et al.. | |
| 4,599,118 | 7/1986 | Han et al.. | |
| 4,649,629 | 3/1987 | Miller et al.. | |
| 4,649,638 | 3/1987 | Fang et al.. | |
| 4,698,787 | 10/1987 | Mukherjee et al.. | |
| 4,805,143 | 2/1989 | Matsumoto et al. | 365/104 |
| 4,852,062 | 7/1989 | Baker et al.. | |
| 4,868,619 | 9/1989 | Mukherjee et al.. | |
| 4,874,713 | 10/1989 | Gioia. | |
| 4,956,308 | 9/1990 | Griffin et al.. | |
| 5,024,960 | 6/1991 | Haken. | |
| 5,032,881 | 7/1991 | Sardo et al.. | |
| 5,036,017 | 7/1991 | Noda. | |
| 5,043,294 | 8/1991 | Willer et al.. | |
| 5,091,329 | 2/1992 | Bekkering et al.. | |
| 5,117,389 | 5/1992 | Yiu | 365/178 |
| 5,141,890 | 8/1992 | Haken. | |
| 5,155,056 | 10/1992 | Jeong-Gyoo. | |
| 5,200,802 | 4/1993 | Miller. | |

FOREIGN PATENT DOCUMENTS

| | | |
|---|---|---|
| 0069493 | 1/1983 | European Pat. Off.. |
| 227 965 | 7/1987 | European Pat. Off.. |
| 401 113 | 12/1990 | European Pat. Off.. |
| 451 883 | 10/1991 | European Pat. Off.. |
| 58-148448 | 3/1983 | Japan. |
| 60-769 | 1/1985 | Japan. |
| 63-64361 | 3/1988 | Japan. |

OTHER PUBLICATIONS

Patent Abstracts of Japan, vol. 9, No. 110 (E-314)(1833) May 15, 1985.
Patent Abstracts of Japan, 58-148448.
Patent Abstracts of Japan, Publication number JP63064361.
"Characterization of As-P Double Diffused Drain Structure," Balasubramanyam et al. IEDM 1984, pp. 782-785.
Patent Abstracts of Japan, vol. 13, No. 304 (E-786)[3652], published Jul. 12, 1989, relating to Japanese Application JP-A-1 081 360, Hitachi Ltd., Mar. 27, 1989.
Patent Abstracts of Japan, vol. 9, No. 85 (E-308)[1804], published Apr. 13, 1985, relating to Japanese Application JP-A-59 217 355, Hitachi Seisakusho K.K., Dec. 7, 1984.
Balasubramanyam, et al., *IEDM 1984*, pp. 782-785.

*Primary Examiner*—Joseph E. Clawson, Jr.
*Attorney, Agent, or Firm*—Robert Groover; Betty Formby; Matthew Anderson

[57] ABSTRACT

A ROM cell array in which the drains are more lightly doped than the sources. This reduces the worst-case capacitance seen by the bitlines, and consequently reduces the access time of the memory.

28 Claims, 1 Drawing Sheet

ROM CELL WITH REDUCED DRAIN CAPACITANCE

This is a divisional application of app'n Ser. No. 07/668,873, filed Mar. 13, 1991 U.S. Pat. No. 5,328,863.

BACKGROUND AND SUMMARY OF THE INVENTION

The present invention relates to a ROM memory cell having a low drain capacitance.

In the accomplishment of ROM memory cells organized according to NOR logic the starting point is typically a substrate of semiconductor material. A gate complex is formed, for example, by a layer of gate oxide-polysilicon-tungsten silicide. There follows an n-implantation, for example of phosphorus, suitable for creating the extension regions of source and drain, followed by a further n+ implantation, for example of arsenic, of part of the regions of source and drain.

After the execution of these operations it is possible to proceed to the programming of the memory cell, carried out by the patterned implantation of a dopant of type p, for example boron, which has the effect of raising the voltage threshold of each implanted cell, from a voltage $Vt<1V$ for an unprogrammed cell to a voltage $Vt=6V$ for a programmed cell.

Due to the large thicknesses of the polysilicon (2000 Å) and of the tungsten silicide (2500 Å) such implantation of programming dopant requires a high energy, which causes the dopant itself to concentrate in the semiconductor substrate at the n+/substrate junctions of the regions of source and drain. In such a way, while the doping of the junction's n+ side is not altered, that of the substrate, already of the p type, rises considerably.

While the high doping of the substrate in the vicinity of the source junction does not create any problems (since the source lines are always grounded in the operation of the ROM,) the doping of the substrate in the vicinity of the drain junction causes a drain capacitance of the programmed cell that is higher than that of the unprogrammed cell: the values measured in the two cases are 2.9fF/bit (unprogrammed cell) and 6.4fF/bit (programmed cell).

In particular, the drain capacitance of each cell affects the bit line capacitance of the memory which, together with the metallizing resistance, the polysilicon resistance and the word line capacity, determines the total access time of the memory cell.

Such unbalance in the capacitance between a programmed cell and an unprogrammed cell is unacceptable because it cannot be corrected by means of a circuit: the number of programmed cells in an ROM can vary by as much as 100% (all cells are programmed/no cell is programmed) and this prevents an optimization of the circuit.

It is thus desirable to eliminate or, at least to substantially reduce, this large difference of capacitance between a programmed cell and an unprogrammed cell.

The object of the present invention is to realize an ROM memory cell having a low drain capacity when the cell is programmed.

According to the disclosed innovative teachings, this object is attained by means of a process for the fabrication of an ROM memory cell having a low drain capacity, comprising the formation of a gate complex on a part of a substrate of semiconductor material which shall form the cell's channel region and a subsequent step of n- implantation outside said channel region for the formation of regions of source and drain having n-doping, characterized in that it subsequently comprises the masking of the drain region and of an adjacent part of the gate complex and a subsequent step of n+ implantation for the creation of an area having n+ doping in said source region.

In this way, with respect to the known art, there is obtained a reduction of doping in the drain region which has the effect of widening the extension of the depletion region of the corresponding junction which, as is known, depends on the doping of the junction side having the lower doping.

The capacity of the drain region is thus reduced and with it the overall access time of the cell.

BRIEF DESCRIPTION OF THE DRAWINGS

The features of the present invention shall be made more evident by an embodiment illustrated as a non-limiting example in the enclosed drawings, wherein.

DETAILED DESCRIPTION

Figure 1:
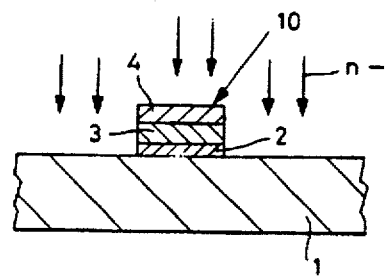
FIGS. 1 to 5 illustrate the different steps of the process according to the invention.

With reference to FIG. 1, on a semiconductor substrate 1 on which, over a part to form the cell's channel region there has been previously superimposed a gate complex 10 formed, in a way known in itself, by a triple layer of gate oxide-polysilicon-tungsten silicide 2, 3, 4, there is executed an n- implantation, in particular an implantation of phosphorus.

Figure 2:
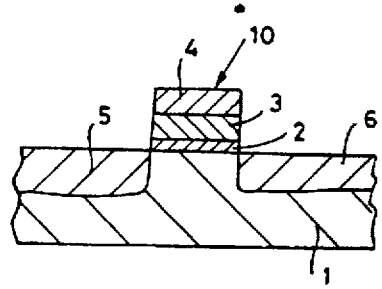

With reference to FIG. 2, such n- implantation has the object of creating two regions of source 5 and of drain 6, respectively.

Figure 3:
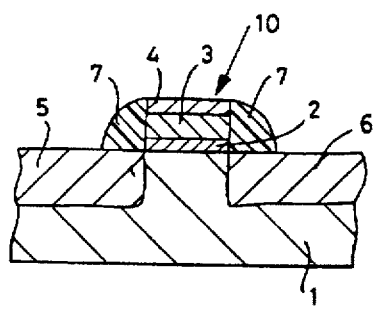

On substrate 1, on both sides of the gate complex 10, there are then deposited silicon dioxide spacers 7 (FIG. 3), which cover part of the regions of source and drain.

Figure 4:
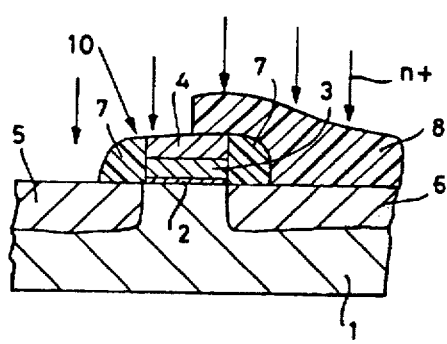

Over the drain region 6 there is subsequently superimposed a resist 8 which extends until it partially covers the gate complex 10 (FIG. 4).

Figure 5:
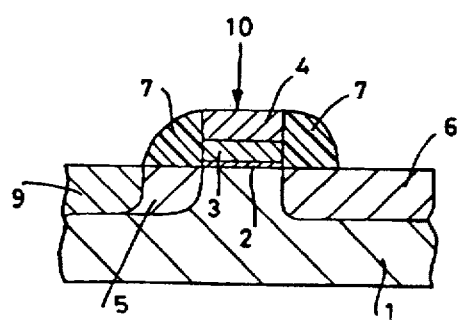

There is then executed an n+ implantation, for example of arsenic, which, as shown in FIG. 5, creates an n+ doping area inside the source region 5.

The cell is now ready for programming, which may be executed conventionally with an implantation of p dopant, for example boron, which determines the rise in the cell's threshold voltage.

The presence of a low doping of the drain region 6 allows an appropriate limitation of the drain capacitance of the programmed cell.

We claim:

1. An integrated circuit read-only memory, operable from first and second power supply connections, where said first power supply connection is more negative than said second power supply connection, comprising:

a plurality of memory cells, each including
an n-type source region connected to said first power supply connection;
an n-type drain region connected to a conductive bit line;
a p-type channel region laterally interposed between said source and drain regions; said source, drain, and channel regions being formed in a common body of monocrystalline semiconductor material; and
a gate electrode capacitively coupled to said channel region to control conduction between said source and drain;

wherein said source region is doped with both phosphorus and arsenic and has a substantially higher dopant concentration than said drain region, which is doped with phosphorus but not arsenic;

wherein some ones of said cells have a first threshold voltage, and other ones of said cells have a second threshold voltage which differs significantly from said first threshold voltage.

2. The memory of claim 1, wherein said first power supply connection is a ground connection, and said second power supply connection is a positive supply voltage connection.

3. The memory of claim 1, wherein said first threshold voltage is about 1V, and said second threshold voltage is about 6V.

4. The memory of claim 1, wherein said gate electrode comprises polysilicon.

5. The memory of claim 1, wherein said gate electrode comprises silicide-clad polysilicon over a gate oxide layer.

6. The memory of claim 1, wherein said gate electrode consists of tungsten silicide over approximately 2000 Å of polysilicon, overlying a gate oxide layer.

7. An integrated circuit read-only memory, comprising:
   a plurality of memory cells, each including
      a first source/drain region connected to a first power supply connection;
      a second source/drain region connected to a conductive bit line;
      a channel region laterally interposed between said first and second source/drain regions; said source/drain and channel regions being formed in a common body of monocrystalline semiconductor material; and
      a gate electrode capacitively coupled to said channel region to control conduction between said source/drain regions;
      wherein said first source/drain region is doped with both phosphorus and arsenic and has a substantially higher dopant concentration than said second source/drain region, which is doped with phosphorus but not arsenic;
   wherein some ones of said cells have a first threshold voltage, and other ones of said cells have a second threshold voltage which differs significantly from said first threshold voltage.

8. The memory of claim 7, wherein said first power supply connection is a ground connection.

9. The memory of claim 7, wherein said first threshold voltage is about 1V, and said second threshold voltage is about 6V.

10. The memory of claim 7, wherein said gate electrode comprises silicide-clad polysilicon over a gate oxide layer.

11. The memory of claim 7, wherein said gate electrode consists of tungsten silicide over approximately 2000 Å of polysilicon, overlying a gate oxide layer.

12. An integrated circuit read-only memory cell, operable from first and second power supply connections, where said first power supply connection is more negative than said second power supply connection, comprising:
   an n-type source region connected to said first power supply connection;
   an n-type drain region connected to a conductive bit line;
   a p-type channel region laterally interposed between said first and second source/drain regions; said source, drain, and channel regions being formed in a common body of monocrystalline semiconductor material;
   an additional variable p-type doping contribution in said channel region, whose presence or absence indicates whether the cell is programmed or not; and
   a gate electrode capacitively coupled to said channel region to control conduction between said source and drain;
   wherein said source region is doped with both phosphorus and arsenic and has a substantially higher dopant concentration than said drain region, which is doped with phosphorus but not arsenic.

13. The memory of claim 12, wherein said first power supply connection is a ground connection, and said second power supply connection is a positive supply voltage connection.

14. The memory of claim 12, wherein said gate electrode comprises polysilicon.

15. The memory of claim 12, wherein said gate electrode comprises silicide-clad polysilicon over a gate oxide layer.

16. The memory of claim 12, wherein said gate electrode consists of tungsten silicide over approximately 2000 Å of polysilicon, overlying a gate oxide layer.

17. An integrated circuit read-only memory cell, comprising:
   a first source/drain region connected to a first power supply connection;
   a second source/drain region connected to a conductive bit line;
   a channel region laterally interposed between said first and second source/drain regions; said source/drain and channel regions being formed in a common body of monocrystalline semiconductor material;
   an additional variable doping contribution of said second conductivity type in said memory cell, whose presence or absence indicates whether the cell is programmed or not; and
   a gate electrode capacitively coupled to said channel region to control conduction between said source and drain;
   wherein said first source/drain region is doped with both phosphorus and arsenic and has a substantially higher dopant concentration than said second source/drain region, which is doped with phosphorus but not arsenic.

18. The memory of claim 17, wherein said first power supply connection is a ground connection.

19. The memory of claim 17, wherein said gate electrode comprises silicide-clad polysilicon overlying a gate oxide layer.

20. The memory of claim 17, wherein said gate electrode consists of tungsten silicide over polysilicon, overlying a gate oxide layer.

21. A read-only memory cell comprising:
   a substrate of semiconductor material;
   a first-conductivity-type source region formed at a first surface of said substrate;
   a first-conductivity-type drain region formed at said surface of said substrate;
   a second-conductivity-type channel region laterally interposed between said source and drain regions; said source, drain, and channel regions being formed in a common body of monocrystalline semiconductor material;
   an additional variable doping contribution which indicates the data stored in each individual cell; and
   a gate electrode capacitively coupled to said channel region to control conduction between said source and drain;
   wherein said source region comprises first and second mutually laterally adjacent portions of different dopant concentrations, and said first portion has the same doping profile and doping concentration as said drain region and is nearer to said channel and to said gate electrode than is said second portion, and said second portion has a heavier dopant concentration than said first portion;

wherein said first conductivity type is N-type; and wherein said second portion is doped with both phosphorus and arsenic and said first portion is doped with phosphorus but not arsenic.

22. The memory cell of claim 21, wherein said source region is connected to ground.

23. The memory cell of claim 21, wherein said drain region is connected to a conductive bit line.

24. The memory cell of claim 21, wherein said gate electrode comprises silicide-clad polysilicon overlying a gate oxide layer.

25. A read-only memory cell comprising:

a substrate of semiconductor material;

a first-conductivity-type source region formed at a first surface of said substrate;

a first-conductivity-type drain region formed at said surface of said substrate;

a second-conductivity-type channel region laterally interposed between said source and drain regions; said source, drain, and channel regions being formed in a common body of monocrystalline semiconductor material;

an additional variable doping contribution which indicates the data stored in each individual cell; and a gate electrode capacitively coupled to said channel region to control conduction between said source and drain, said gate electrode having substantially vertical sidewalls and having insulated sidewall spacers on said sidewalls;

wherein said source region comprises first and second mutually laterally adjacent portions of different dopant concentrations, and said first portion has the same doping profile as said drain region and is aligned to said sidewall, and said second portion has a heavier dopant concentration than said first portion, and is aligned to the edge of said sidewall spacer;

wherein said first conductivity type is N-type; and wherein said second portion is doped with both phosphorus and arsenic and said first portion is doped with phosphorus but not arsenic.

26. The memory cell of claim 25, wherein said source region is connected to ground.

27. The memory cell of claim 25, wherein said drain region is connected to a conductive bit line.

28. The memory cell of claim 25, wherein said gate electrode comprises silicide-clad polysilicon overlying a gate oxide layer.

* * * * *